United States Patent [19]

Warner

[11] 4,358,832

[45] Nov. 9, 1982

[54] MINIMIZED MAGNETIC CORE MEMORY DRIVER SYSTEM

[75] Inventor: Richard C. Warner, Morris Plains, N.J.

[73] Assignee: The Singer Company, Little Falls, N.J.

[21] Appl. No.: 178,415

[22] Filed: Aug. 15, 1980

[51] Int. Cl.³ .............................................. G11C 8/00
[52] U.S. Cl. ...................................... 365/196; 365/243
[58] Field of Search ................ 365/195, 196, 242, 243

[56] References Cited

U.S. PATENT DOCUMENTS 3,568,170  3/1971  Catalani, Jr. .................... 365/243

Primary Examiner—James W. Moffitt
Attorney, Agent, or Firm—Morris Liss; Thomas W. Kennedy

[57] ABSTRACT

The complexity of a memory driver system is decreased by minimizing the number of half-select current driver circuits and corresponding terminals and wires connected between the driver lines and the core stack. This is effected by maximizing the number of current paths between memory drivers.

5 Claims, 4 Drawing Figures

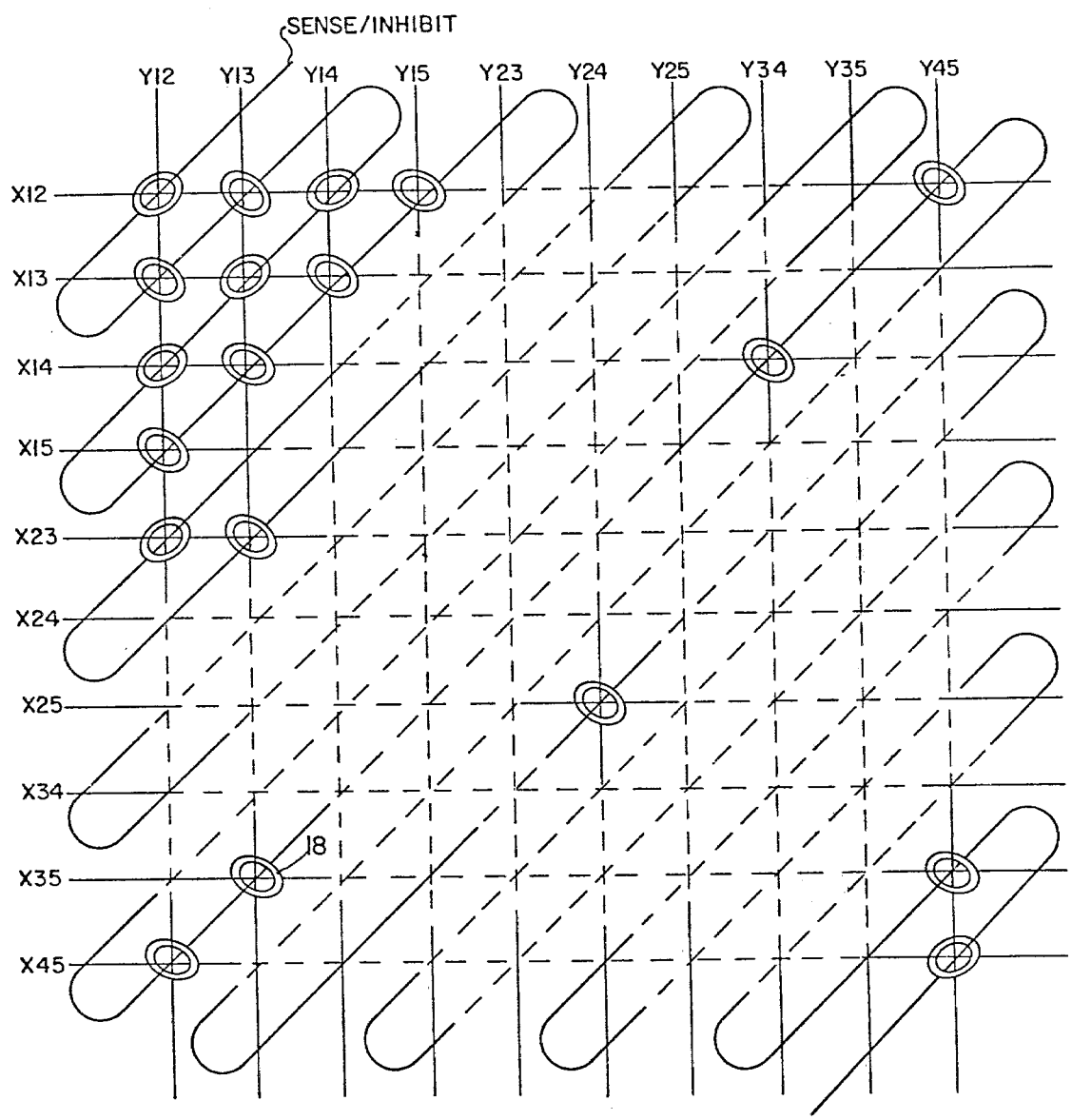
PRIOR ART  FIG. 4

MINIMIZED MAGNETIC CORE MEMORY DRIVER SYSTEM

BACKGROUND OF THE INVENTION

The present invention relates to computer memory systems and more particularly to a driver system for a magnetic core memory.

BRIEF DESCRIPTION OF THE PRIOR ART

Memory drivers have been implemented in integrated circuit configurations. In FIG. 1, such a prior art integrated circuit application is shown. The prior art circuit of FIG. 1 is derived from Bulletin No. DL-S7311437, March, 1971, published by Texas Instruments, Inc. (pages 10-32). In the circuit of FIG. 1, sources and syncs are arranged in pairs from which many drive-lines branch off as shown in the figure. Each drive-line is served by a unique combination of two source/sync pairs so that a selection matrix is formed. For example, to select drive-line 13, decoder A must be set to 3, enabling source X of memory driver B to drive-lines 12 through 15, and decoder B must be set to 2, providing a sync at Y of memory driver D for drive-line 13 only. Alternately, to drive current in drive-line 13 in the opposite direction, the enablement signal on the source sync strobe lines is changed. Thus, the described prior art requires the establishment of a source for the horizontal (X) drive-lines and a sync in the vertical (Y) drive-lines. Given M vertical and N horizontal drive-lines, (M×N) drive-lines are developed. If M=N, then $N^2$ drive-lines are developed. The drive-lines of each of the original matrices (X and Y) are now interrelated in a matrix of their own. In the case of two equal square matrices measuring N drivers on each side, it is evident that there are $N^2 X$ lines and $N^2 Y$ lines, thereby resulting in a final matrix of $N^4$ addressable crosspoints, or words. The ratio of addressable crosspoints to drivers in such a system is then:

$$N^4/4N = N^3/4$$

This equation represents the most efficient use of drivers in matrix wiring schemes of the type described. Although the illustrated prior art approach operates generally satisfactorily, it suffers from the disadvantage of failing to utilize all of the possible paths between available driver lines. Thus, an unnecessarily high number of half-select current driver circuits and associated driver output terminals and wires must exist between the driver lines and the memory core stack.

BRIEF DESCRIPTION OF THE PRESENT INVENTION

The primary object of the present invention is to decrease the complexity of a memory driver system thereby increasing its reliability and decreasing its cost. This is achieved by decreasing the number of half-select current driver circuits and corresponding terminals and wires connected between the driver lines and the core stack. This is achieved by utilizing, to the fullest extent possible, all paths between memory drivers.

The present invention makes fuller use of the multiplexing capability of the available drivers by selecting drivers on a two-out-of-N basis to enable a particular drive-line, instead of on an N×M basis, as explained in connection with the prior art. Given the same 4N drivers used to develop the number of addressable crosspoints, as described in the previous section, the present invention is capable of developing crosspoints as follows:

2N drivers would be dedicated to the addressing of X drive-lines, and 2N drivers would be dedicated to the addressing of Y drive-lines. Then, the number of X, Y drive-lines would each be equal to 2N taken two at a time (r):

Number $X$, $Y$ drive-lines = combination $(2n, r)$ =

$$\frac{(2n)!}{(2n-r)!r!} = 2n^2 - n$$

Number of crosspoints = $(2n^2 - n)^2 = 4n^4 - 4n^3 + n^2$

Ratio of crosspoints/drivers = $\frac{\text{Number of Crosspoints}}{\text{Number of Drivers}}$ =

$$\frac{4n^4 - 4n^3 + n^2}{4n} = n^3 - n^2 + \frac{n}{4}$$

Efficiency ratio = $\frac{\text{Crosspoints/Driver (invention)}}{\text{Crosspoints/Driver (prior art)}}$ =

$$\frac{n^3 - n^2 + \frac{n}{4}}{\frac{n^3}{4}} = 4 - \frac{4}{n} + \frac{1}{n^2}$$

Limit = 4

$$n \longrightarrow \infty$$

Thus, it is shown that the present invention can address approximately four times as many cores as the discussed prior art when using the same number of drivers. Looked at from the standpoint of driving a given number of cores, it can be shown that the new method results in a decrease of approximately 25 percent to 30 percent of the number of drivers required.

The above-mentioned objects and advantages of the present invention will be more clearly understood when considered in conjunction with the accompanying drawings, in which:

BRIEF DESCRIPTION OF THE FIGURES

FIG. 4 is an electrical schematic diagram of a core stack showing the interleaving of horizontal and vertical drive-lines.

DETAILED DESCRIPTION OF THE INVENTION

Figure 1:
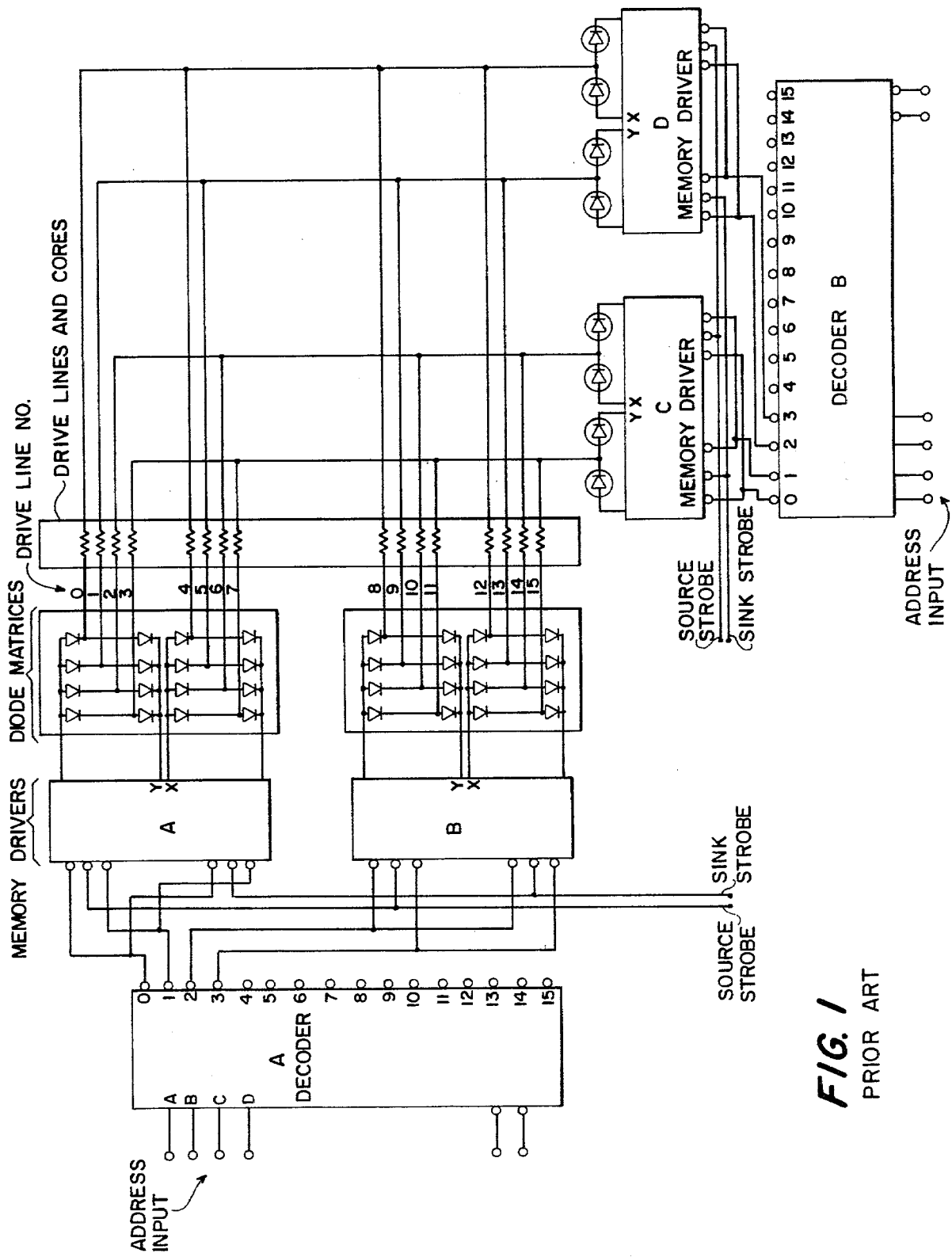
FIG. 1 is a block diagram of the prior art.
Figure 2:
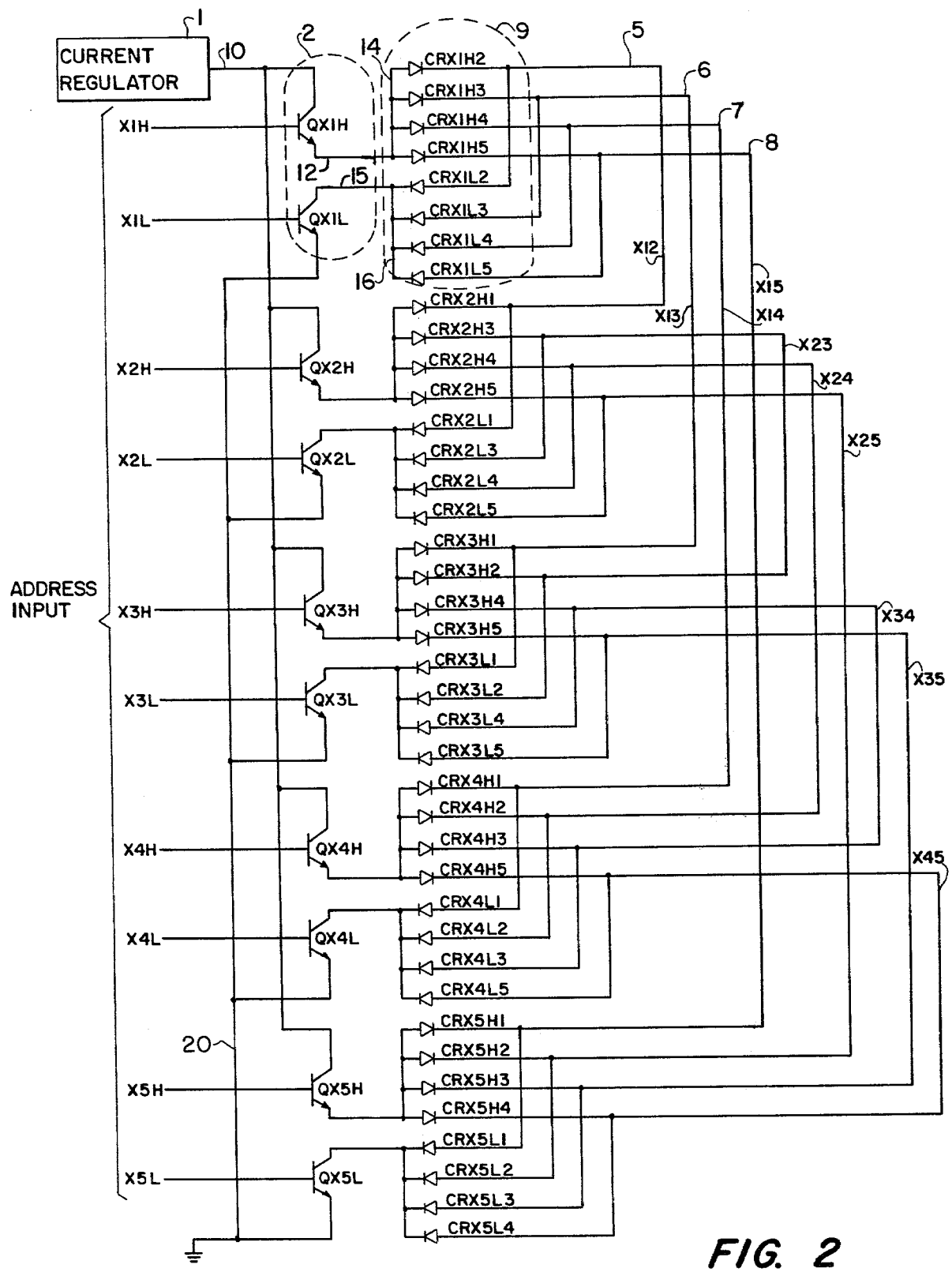
FIG. 2 is an electrical schematic diagram of the driver system for the horizontal drive-lines of the present invention.
Figure 3:
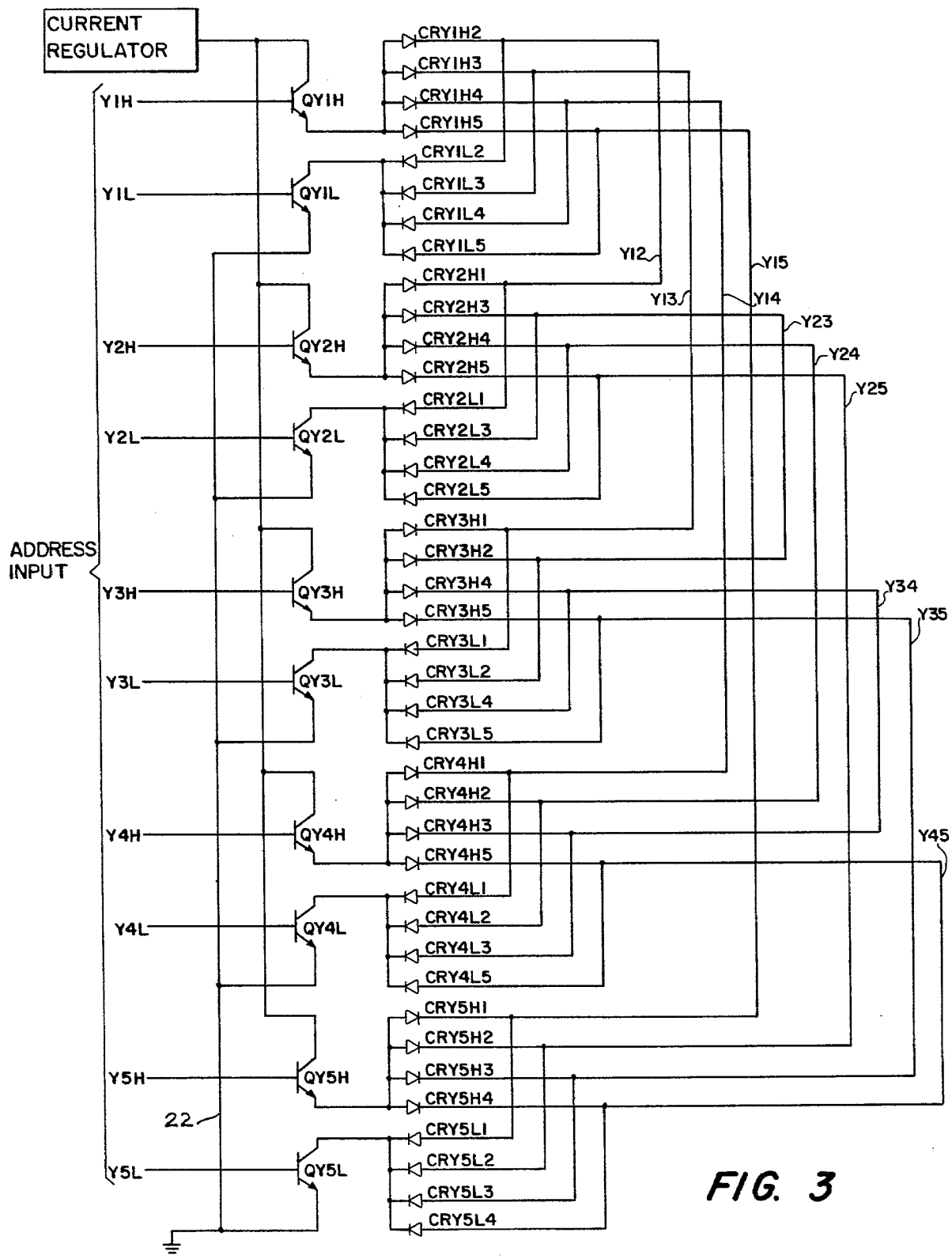
FIG. 3 is an electrical schematic diagram of the driver system for the vertical drive-lines of the present invention.

The previously discussed prior art drawing of FIG. 1 illustrates the electric schematic diagram for driving the horizontal or X lines of a core matrix such as shown in FIG. 2. A similar configuration of components is shown in FIG. 3 and represents the vertical or Y lines. The core matrix and drive lines shown in FIG. 4 constitute a conventional three-wire coincident current memory system. It is the driver system shown in FIGS. 2 and 3 which constitute the invention.

Referring to FIG. 2, the X line driver system is shown to include a current regulator 1 of conventional design which provides regulated DC current to the transistor driver switches. Each driver, such as shown by reference numeral 2, comprises a pair of transistor switches, such as the upper two illustrated transistors QX1H and QX1L. The collector terminals of the source transistor switches QX1H, QX2H, QX3H, QX4H and QX5H are connected to the output bus 10 of the current regulator 1. The emitter terminals of the sink transistor switches QX1L, QX2L, QX3L, QX4L and QX5L are connected to the ground bus line 20. All of the drivers are located to one side of the drive lines 5, 6, 7 and 8.

Energization of a selected X line occurs when current from a transistor in a driver acts as a source and transmits current through the preselected diode of the diode group such as 9 which routes the source current through a selector X line for return through the diode group 9 to a transistor of another driver which operates in the circuit as a sink. The main design criterion of the present invention is the arrangement of drivers permitting a source transistor in one driver to cooperate with a sink transistor in any of the other drivers thereby permitting population of all of the possible paths between available drivers.

The upper half of the diode group 9 has each diode anode connected in common to lead 14, which is in turn connected to the emitter 12 of the corresponding source transistor switch QX1H. The remaining lower half of the diode group 9 has each cathode, connected in common, along lead 16, to the collector 15 of transistor switch QX1L. The drive-lines such as 5, 6, 7 and 8 are connected to opposite terminals of the mentioned diodes to complete a current path between the drivers and the drive-lines.

In order to obtain a better comprehension of the present invention, the inventive system will be described in terms of five drivers, each driver including a pair of transistor switches. In the present example, this number of drivers will drive ten lines. However, the specific number of drivers and lines mentioned is merely illustrative and in no way is intended to limit the present invention. Generally, the design criteria for the present invention is expressed as follows:

$$\frac{n!}{(n-2)!2!} = \text{Number of drive-lines}$$

where n=number of drivers. Thus, in the example shown in FIG. 2, where ten drive-lines are to be specified, n=5, which is the number of drivers needed. It should be borne in mind that each driver includes two transistor switches.

The number of necessary diodes per transistor switch is equal to (n−1). Thus, as seen in the example of FIG. 2, four diodes must be connected to each transistor switch of a diode group, such as 9, with the direction of the four diodes associated with transistor switch QX1H being in the reverse direction from those associated with transistor switch QX1L. The nomenclature for each transistor switch is chosen so that it associates with particular driven lines. Thus, QX1H controls switching to drive-lines 5, 6, 7 and 8 (which are hereinafter assigned the nomenclature X12, X13, X14 and X15) in a manner permitting source current to flow from the transistor QX1H through the diode group 9 for return to transistor QX1L serving as a sink for the same associated drive-lines. The diode group 9 provides electrical disjunctivity for proper line selection. Diode nomenclature in FIG. 2 has been chosen so that the first numeral and the letter which follows the numeral specify the transistor switch with which the particular diode is associated, while the last numeral indicates the other transistor switch associated with the same drive-line. It will be further noted that the two numerals in a particular diode designation considered together in ascending order, specify the particular drive-line.

FIG. 3 illustrates the development of the driver system for the vertical or Y drive-lines. A square final matrix is assumed so that the numbers of drive-lines, drivers and diodes are identical and identically configured with those shown in FIG. 2 for the horizontal or X lines. Thus, the only differences exist in the changes in nomenclature from X to Y. The comments made in connection with FIG. 2 are equally appropriate to those of FIG. 3.

FIG. 4 illustrates the matrix of cores, on addressable crosspoints, formed by the interweaving of the X and Y drive-lines. Also shown in the figure is a SENSE/INHIBIT lead. A previously mentioned, the matrix shown in FIG. 4 is conventional.

In order to appreciate the operation of the present invention, it should be understood that one core at a time is addressed in the matrix of FIG. 4 as is done in the prior art. This, of course, is done by selecting the two drive-lines that intersect at a selected core. However, in order to accomplish this, it is necessary to select the proper drivers which is the task of the present invention.

The operation of the invention is best appreciated by considering an example. Thus, assume that a core 18 in FIG. 4 is to be addressed. This core is at the intersection of driver lines X35 and Y13.

The READ mode enablement of the proper X drive-line requires that QX3H and QX5L be switched on. Transistor switch QX3H serves as a source while transistor QX5L serves as a sink. In order to select drive-line Y13, transistor switch QY1H is turned on and serves as a source while transistor QY3L serves as a sink for drive-line Y13. The combination of additive half-select currents through the selected core would switch the core to a logic "0" state. If the core was already in the logic "0" state, the flux produced and coupled into the SENSE/INHIBIT line of FIG. 4 would be smaller or less than the flux produced if the core were initially at a logic "1" state and then switched to the logic "0" state. In this respect, the core switching operates in the conventional manner. Signals of sufficiently different amplitude, which can be easily discriminated between, will be induced in the SENSE/INHIBIT line. This occurs during the READ mode.

The WRITE mode of the memory requires a resetting of the cores addressed to its initial value or to some other, arbitrary value. If the direction of current flow in the two selected drive-lines, in the disclosed example X35 and Y13 is now reversed, the core will be switched from a logic "0" to a logic "1" value because of the additive effect of the two half-select currents. If it is desired to maintain the core at a logic "0" state, it is necessary to inject an opposing half-select current into the SENSE/INHIBIT winding, where it will be subtracted from the combined currents and flux of the X35 and Y13 lines. This prevents the core from switching.

In order to have reversed the current flow directions in lines X35 and Y13, it would be necessary to have first turned transistor switches QX3H, QX5L, QY1H and QY3L off, and then have switched transistor switches QX3L, QX5H, QY1L and QY3H on.

As will be appreciated by those of ordinary skill in the art, PNP transistors may be used in lieu of the NPN transistors as shown in FIGS. 2 and 3. Likewise, the current regulators 1 may be placed in different parts of the circuit. For example, they may be placed along the ground bus lines 20 (FIG. 2) and 22 (FIG. 3). Other variations of this include the addition of different types of line bias networks. It should also be noted that the cores may be wound in the coincident current mode or in the anti-coincident current mode, or in both modes, simultaneously, as is presently done in the advanced state of the art systems. This latter method doubles the number of cores that can be uniquely addressed by a given number of drivers. It is also noted that FIG. 4 shows only one of the many possible ways to wind or thread the core planes. The SENSE/INHIBIT line could be positioned either vertically or horizontally, instead of diagonally, as shown in the figure, or in some combination thereof to best balance out flux build-ups.

Accordingly, the construction of the present core memory driver system permitting any two drivers to cooperate with each other as a source-sink combination results in maximum utilization of the drivers thereby generally permitting fewer drivers to be employed in the selection of drive-lines.

It should be understood that the invention is not limited to the exact details of construction shown and described herein for obvious modifications will occur to persons skilled in the art.

I claim:
1. A core memory driver system comprising:
   a plurality of drivers, each including a pair of switches;
   a plurality of core drive-lines;
   means connecting each of the switches to the lines to enable current to flow from a preselected switch, operating as a source for a corresponding driver, to another switch operating as a sink in any of the remaining drivers, thereby populating all of the possible paths between drivers;
   wherein the relationship between the number of drivers and drive-lines is:

$$\frac{n!}{(n-2)!\,2!} = \text{number of drive-lines}$$

where n=number of drivers.
2. The system set forth in claim 1 wherein each switch includes a transistor comprising:
   a first terminal connected to a source of regulated current;
   a second terminal connected to a corresponding address input; and
   a third terminal connected in circuit with predetermined drive-lines.
3. The system set forth in claim 2 together with a plurality of similarly biased diodes connected between the third terminal of each transistor and the predetermined lines for ensuring current flow between only two drivers at a particular time; and further wherein
   the number of diodes connected to the third terminal of each transistor equals (n−1) where n=number of drivers.
4. The system set forth in claim 3 wherein a first driver system drives X lines of a core matrix and a second driver system drives the Y lines of the core matrix.
5. The system set forth in claim 4 together with a three-wire core matrix including the X and Y lines in addition to a common SENSE/INHIBIT line interleaving the cores of the matrix.

* * * * *